(12) United States Patent
Murano et al.

(10) Patent No.: US 7,589,463 B2
(45) Date of Patent: Sep. 15, 2009

(54) TOP-EMITTING DEVICE AND ILLUMINATION DEVICE

(75) Inventors: Sven Murano, Dresden (DE); Jan Birnstock, Dresden (DE)

(73) Assignee: Novaled AG, Dresden (DE)

( * ) Notice: Subject to any disclaimer, the term of this patent is extended or adjusted under 35 U.S.C. 154(b) by 401 days.

(21) Appl. No.: 11/463,697

(22) Filed: Aug. 10, 2006

(65) Prior Publication Data

US 2007/0035236 A1      Feb. 15, 2007

(51) Int. Cl.
    *H01J 1/62* (2006.01)
(52) U.S. Cl. .................... 313/506; 313/504
(58) Field of Classification Search ........... 313/498, 313/502–506
    See application file for complete search history.

(56) References Cited

U.S. PATENT DOCUMENTS

| | | | |
|---|---|---|---|
| 6,476,550 | B1 | 11/2002 | Oda et al. |
| 6,630,684 | B2 | 10/2003 | Lee et al. |
| 2001/0038102 | A1 | 11/2001 | Kawase |
| 2003/0062636 | A1 | 4/2003 | Chen |
| 2003/0164679 | A1 | 9/2003 | Hamano et al. |
| 2004/0012980 | A1 | 1/2004 | Sugiura et al. |
| 2004/0227446 | A1 | 11/2004 | Fujimoto et al. |

FOREIGN PATENT DOCUMENTS

| | | |
|---|---|---|
| EP | 1406474 | 4/2004 |
| GB | 2361356 | 10/2001 |
| GB | 2390215 | 12/2003 |

*Primary Examiner*—Vip Patel
(74) *Attorney, Agent, or Firm*—Sutherland, Asbill & Brennan, LLP

(57) ABSTRACT

The invention refers to a top-emitting device, particularly organic light-emitting diode having a layer arrangement applied on a substrate, which layer arrangement comprises a bottom electrode arranged on the substrate and a top electrode through which a light emission is effected, and also a stack of organic layers arranged between the bottom electrode and the top electrode where, at the bottom electrode, a surface facing towards the stack of organic layers is formed in light-reflecting fashion at least in a partial region and being provided with a surface structure that defines a reflection of light generated in the stack of organic layers at the bottom electrode, and where the surface structure is formed by means of mechanical shaping.

17 Claims, 4 Drawing Sheets

TOP-EMITTING DEVICE AND ILLUMINATION DEVICE

CROSS-REFERENCE TO RELATED APPLICATION

Figure 1A:
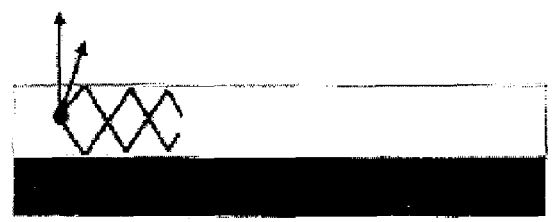

Applicants hereby claim priority under 35 U.S.C. 119(a) to European Patent Application No. 05017542.1, filed Aug, 11, 2005, the disclosure of which is expressly incorporated herein by reference in its entirety.

The invention refers to a top-emitting device, in particular an organic light-emitting diode, having a layer arrangement applied on a substrate, which layer arrangement comprises a bottom electrode arranged on the substrate and a top electrode through which a light emission is effected, and also a stack of organic layers arranged between the bottom electrode and the top electrode, as well as an illumination device.

BACKGROUND OF THE INVENTION

Organic light-emitting diodes, which when abbreviated are also and usually designated as OLEDs, have in particular in an embodiment for white light generation a high potential for applications in the field of illumination and displays. Substantial improvements have been achieved in this field in recent years, not only with regard to the efficiencies obtained but also with regard to the life service duration of the devices. The performance efficiencies of white OLEDs are presently in the range of 10 to 25 lm/W, and life service durations of over 10000 hours are realizable. For a wide-scale commercialization in the field of general illumination applications, however, improvements with particular reference to performance efficiency are necessary because at the moment the market is controlled by high-efficient technologies for the generation of white light, such as fluorescent tubes for example, with efficiencies of up to 100 lm/W.

It is generally known that conventional OLEDs only emit about 25% of the generated light, while the major part remains in optical modes of the substrate or the organic layers, and is subsequently lost in the process. The reason here is that the light within an OLED in optical media is formed with a refractive index of approx. 1.3 to 1.8. If this light now impinges on an optical medium with a low refractive index, for example a further layer within an OLED-stack, the substrate on which the OLED is established, or one of the electrodes, then a total reflection occurs when a certain value of the angle of incidence is exceeded.

Particularly during the transition of the light into air, such a refractive index leap necessarily occurs, through which merely light, which impinges onto the boundary surface to air under relatively small angles, can emerge from the OLED device. This boundary angle for the total reflection amounts to arcsin(1/n) during transition to air, where n is the refractive index of the material on the boundary line to air.

Manifold considerations are known, which are focused on an improvement of this light extraction. Worth mentioning would be, for example, the depositing of scatter foils, micro-lenses or specially structured surfaces on a substrate side of the OLED, which forms the boundary surface towards the air and where a major part of the undesirable total reflection of the light takes place. These measures are aimed at extracting light, which "is captured" in the transparent substrates of the OLEDs.

Structural elements on the basis of OLEDs, however, which are deposited on a reflecting base contact, so-called top-emitting OLEDs, are not limited in their performance capacity by losses in the transparent substrate. Nevertheless, in this case also, the luminous efficiency is restricted in principle by the loss mechanisms because a major part of the emitted light "is captured" now within the organic layers of the OLED due to total reflection. Possible improvements of the luminous efficiency are known here also, particularly by means of the formation of so-called micro cavities or also with the help of additional extraction layers, which improve the reflection conditions at the boundary surface of the OLED in the direction towards air.

Despite the already achieved improvements for extraction of the emitted light, considerable improvements are still necessary compared with the state of the art. This particularly involves light which itself is captured in the modes of the organic layers of the OLED. It is known that the light captured here is usable in principle as soon as the organic layers are not located on a smooth substrate but when this surface is grooved, for example. As a result, light hits the boundary surface of the area of organic layers at various angles and can be extracted in this way, as shown schematically in FIGS. 1A and 1B. This description by means of geometrical radiation optics is only approximately correct with regard to layer thicknesses which can lie below the light wavelength, but it describes the phenomenology of non-smooth substrates to a sufficient degree. Such methods have already been described, for example in the document GB 2361356 A for transparent substrates with transparent bottom contact electrode or in the document GB 2390215 A for active matrix display elements with grooved pixel structure.

For the use of white OLEDs in the illumination technology it is therefore necessary to adopt suitable extraction methods which can, in addition to this, be incorporated inexpensively into the manufacturing process. At present, it is taken for granted that an OLED surface of 1 cm$^2$ for illumination purposes shall cost only a few cents so that its usage is economically purposeful. However, this also means that only particularly inexpensive methods can be selectable in any event for the increase of light extraction.

For applications of OLEDs as illuminating elements it is furthermore necessary to execute the devices on a large-surface scale. If, for example, an OLED is operated with a luminance of 1000 cd/m$^2$, surfaces in the region of some square meters will be required in order to illuminate an office room, for example.

With the construction of OLEDs of this size, however, there is a problem with the electrode conductivity of the transparent electrode of the device. Normally, OLEDs are deposited on transparent substrates coated with ITO (indium tin oxide) where ITO, however and depending on the layer thickness and composition, has a layer resistance of between 5 and 100 $\Omega/\forall$. For large-surface OLEDs, however, significantly smaller layer resistances are required because relatively high currents have to be transported through the electrodes and, thus, a significant voltage drop can occur across the electrodes, insofar as these have very small resistances smaller than 1 $\Omega/\forall$, for example. Due to the layer resistance of the ITO, with OLED surfaces of even a few square centimeters, this effect leads to significant luminance decays. In order to reduce this problem, the ITO can be reinforced with additional metal tracks, which then transport the major part of the flowing currents. For this purpose, however, the metal tracks must have a certain diameter, for which reason they normally have a height of some hundred nanometers as they would be otherwise too wide, and through which the active surface of the OLED structural element is too strongly reduced. With the use of transparent ITO-coated substrates with a metal reinforcement, however, a passivation of the metal tracks with an insulating layer is necessary because short-circuits can otherwise occur between the bottom and the top electrode of the device.

Taking these facts into account, the use of highly conductive bottom contacts on the substrate would seem purposeful. Electrodes with a correspondingly high conductivity of <1 Ω/∀ can only be obtained with metals according to the state of the art. Corresponding conductivities can, however, only be achieved with layer thicknesses which then only have a very low level transparency or are not transparent at all. Therefore, with the use of highly conductive bottom contacts, the OLED must have a transparent top electrode, so that it must be executed in a top-emitting manner. Such a transparent top electrode can, for example, consist of thin metal layers or ITO.

The considerations with regard to layer resistance apply also on the same scale for the top electrode also. The conductivity of the transparent electrode is thus also inadequate here in order to transport the current flowing in the OLED without significant voltage losses, insofar as the device exceeds a certain size as would seem necessary for illumination applications. However, a reinforcement of the top electrode by means of metal conductor tracks is achievable to a significantly easier degree in this case because an additional passivation step can now be dispensed with. The metallic reinforcements for the current transport can in fact be deposited onto the top electrode in the form of a lattice, for example. The danger of a shortcircuit between anode and cathode of the OLED does no longer have to be taken into consideration.

In this case, the processing of the metal tracks is relatively uncomplicated as only structures have to be formed in dimensions, which enable a current flow through the electrode without any significant voltage drop. For example, the metal tracks could form a grid with a mesh size of approximately one centimeter, through which the voltage drop can be minimized to a negligible value by means of the segmented and transparent electrode partial surfaces established in this way.

Of course, there are also alternative approaches for bypassing the problem, which results on the basis of a serial resistance during the transport of current. Particularly worth mentioning here is the fact that, repeatedly, the series connection of OLED units within a device was proposed. However, such a solution presupposes a more complex structure of the substrate as well as additional masking steps.

Substantial progress with regard to efficiency as well as life duration service has been achieved in recent times for top-emitting OLEDs. For this reason, it can be assumed that top-emitting structures are of major interest in the field of illumination applications, among other things also because of the option of dispensing with ITO as a material, which is a significant cost factor for OLEDs. For an economical breakthrough of the OLED technology, however, and as already mentioned, an inexpensive production with simultaneous high efficiency of the device is necessary in particular. For this purpose, for example, attention is focused on production methods in a "roll-to-roll" process. In order to develop an economically competitive OLED illumination technology, it is furthermore particularly necessary to inexpensively establish any possible extraction methods.

Up to the present, it was not possible to commercialize the OLED technology for applications as illuminating elements, particularly in view of the fact that efficiencies and price of OLEDs are not yet competitive. Methods are described in which scatter lattices (refer to U.S. Pat. No. 6,476,550), two-dimensional photonic structures (refer to U.S. Pat. No. 6,630,684), holograms or the like are integrated for the purpose of extraction improvement. However, these methods are based on relatively complex process steps, photolithography for example.

For so-called bottom-emitting OLED structures in which a transparent substrate is used, through which the light emission is effected all the way through and in the downward direction, it was proposed to apply regular structures by means of a stamp (refer to GB 2361356 A). Methods are described in this document for the manufacture of a grooved surface on a transparent substrate where polymer layers are formed with the use of a tool. In this case, methods are disclosed in which the form-shaping is effected by means of photo-hardening of a liquid polymer, which is kept in shape during the hardening process with the help of a form tool, or with which a polymer solution is formed with a tool and hardened by means of the evaporation of the solvent. For top-emitting OLED structures, however, structured bottom electrodes are deployed according to the state of the art by means of complex methods (refer to GB 2390215 A), for example photolithography, and these bottom electrodes are not selectable for economical mass production. One reason for this is the fact that it is assumed for top-emitting OLEDs in the state of the art that the surfaces of the substrates that are used have to be very smooth as short-circuits occur on rough surfaces. In the case of the bottom-emitting devices a completely different bottom electrode is envisaged that is usually made from a conductive glass, whereas typical bottom electrodes for top-emitting devices normally consist of a metal or a metal stack. This difference at the boundary surface between substrate and the zone of organic layers means that there are very different requirements for top-emitting and bottom-emitting devices with regard to the architecture of the zone of organic layers and of the substrate. Therefore, only a few highly efficient and long-life top-emitting devices are known whereas, on the other hand, a plurality of bottom-emitting devices has been described.

In particular the roughness of the bottom electrode is a problem for a processing of OLEDs because very thin overall layer thicknesses of approximately 100 nm are normally used for the zone of the organic layers in the OLED stack, through which there is a danger of short-circuiting between the electrodes. For this reason, either special planarizing layers have to be deployed in active matrix display elements, for example, or the bottom electrode surface must be executed in such a way that existing height differences are provided with suitably flat edge angles, through which an inclination to short circuiting can be suppressed.

SUMMARY OF THE INVENTION

It is the task of the invention to provide a top-emitting device with an improved light extraction which can be produced economically and which is suitable for a mass production process.

This task is solved according to the invention by means of a top-emitting device according to the independent Claim 1. Advantageous embodiments of the invention are subject-matter of dependent Sub-Claims.

Figure 8:
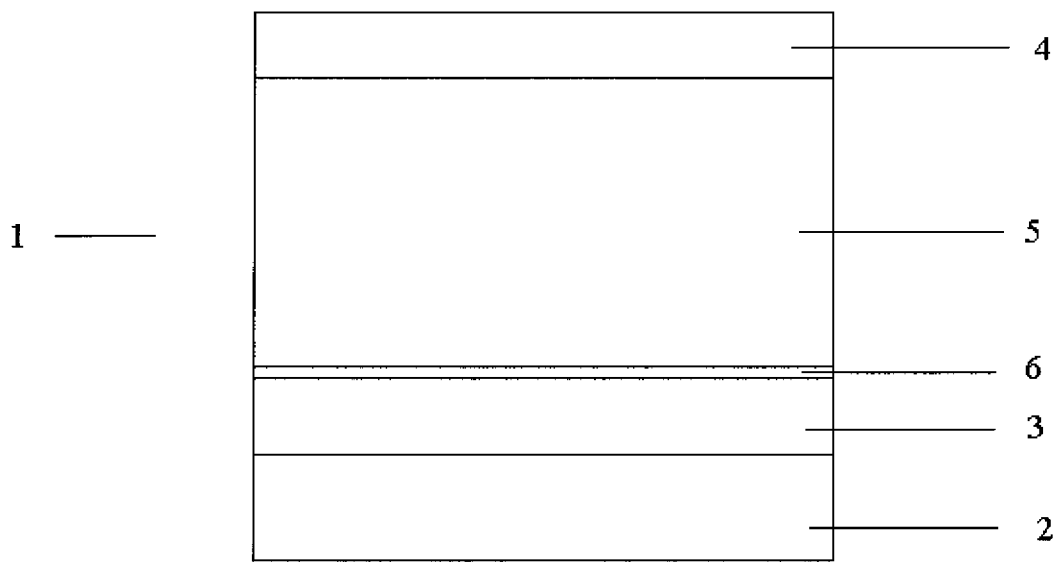

According to the invention, as illustrated in FIG. 8, a top-emitting device 1, particularly an organic light-emitting diode, is envisaged with a layer arrangement deposited onto a substrate 2, which layer arrangement comprises a bottom electrode 3 arranged on the substrate and a top electrode 4 through which a light emission is effected, as well as a stack of organic layers 5 arranged between the bottom electrode and the top electrode where, at the bottom electrode, a surface 6 facing towards the stack of organic layers is formed in light-reflecting fashion at least in a partial region and being provided with a surface structure that defines a reflection of light generated in the stack of organic layers at the bottom electrode, wherein the surface structure is formed by means of mechanical shaping.

It was surprisingly found in experiments that long-life top-emitting devices with very low inverse currents can be produced also on rough surfaces, which are formed as a result of the surface structure (surface roughness). The low inverse currents are regarded as verification that short-circuits do not occur between bottom and top electrodes despite the surface roughness (surface structure). The mechanical shaping for forming the surface structure enables economical mass production, particularly because the shaping tool can be used for the manufacture of a plurality of devices.

For the first time, a top-emitting device with a stack of organic layers is proposed that has, on a very rough surface, high efficiency as well as long life service duration and even low currents in the inverse direction. This result is surprising and comes from comprehensive test series and long optimization. Top-emitting devices have a high potential as market-capable technology and can be manufactured in an uncomplicated manner. Thus, the invention is a significant module for a future mass production of organic light-emitting devices for illumination applications.

The mechanical shaping can be performed, for example, by means of stamps. In order to manufacture a stamp with a corresponding surface structure, it can be envisaged, for example, to structure a silicon surface by means of a photo-lithographic method. The structuring of silicon in this way is known technically. Here, structures in the submicrometer range can be produced. Based on the permanent continued development in the field of semiconductor technology, further lithographic manufacturing methods such as, for example, EUV-lithography or X-ray lithography are conceivable in principle for the manufacture of such surfaces. Admittedly, the manufacture of a corresponding stamp involves a high consumption of work and costs. However, such a stamp can be used for a very large number of devices to be produced, and in this way their economical fabrication is ensured.

A method for the structuring of polymer surfaces is described in the doctoral thesis of Natalie Stutzmann (doctoral thesis ETH Zürich 2001, Technische Wissenschaften (Technical Sciences) ETH Zürich, No. 14046, 2001). This document deals with the possibilities of processing polymer materials by means of standard methods, particularly with the embossing method, in order to produce microstructured surfaces in a plain and uncomplicated fabrication manner.

With one embodiment form of the invention it is envisaged that the surface structure formed by means of mechanical shaping is executed in a non-regular manner. The structuring of the surface is preferably performed with structures in dimensions of approximately 50 nm to approximately 50 µm, particularly in dimensions of wavelengths of visible light. In principle, electromagnetic waves are scattered according to two different mechanisms, the so-called Rayleigh scattering and the so-called Mie or Lorenz-Mie scattering. Whereas the former is effected on objects with significantly smaller dimensions than the wavelength of the scattered radiation and is relatively weak, the latter is effected on structures with dimensions in the range of the radiation wavelength and is relatively strong. Rayleigh scattering is effected with major wavelength dependence, while the Mie scattering is effected to the greatest possible extend wavelength independent. The advantage with the use of scattering centers/structures in the magnitude of the light wavelength is therefore two-fold: the scattering is effected on a larger scale, through which a higher extraction increase can be obtained, and it takes place independent of the color of the light. This is, of course, desirable because a wavelength-dependent extraction increase would result in a color falsification of the illuminating element.

The purpose of the irregularity of the embossed surface structure is that regular structures lead to an angle dependence of the scattering behavior in the zone of the deposited surface structure. This is not desirable, however, particularly in the case of a broad-band light emission as in the case of white light because then the illuminating element would emit light of different colors under varying angles of observation. For this reason, an extraction structure is selected which suppresses the angle dependence of the emission in an ideal manner instead of supporting this.

Ductile or thermoplastic polymers, such as for example fluoroethylene propylene (FEP) are preferably selectable as materials for the layer with the surface structure, which is formed by means of mechanical shaping, an embossing process in particular. The selection of the polymers is influenced by various criteria, for example, materials are preferably selected, which only have a very minor inclination of adhesion to other materials. In this case and for this purpose, perfluorinated polymers or polyolefines are selectable, substances which are known for their non-adhesion properties. Due to the minor inclination to adhesion the detaching action of the mechanical tool for forming the surface structure, involving a stamp for example, is facilitated. Furthermore and in particular, the formation of mechanical defects in the embossed polymer is reduced during the detaching action.

In addition, the invention enables the use of polymers with poor optical properties, particularly of partial crystalline polymers. These do, of course, have a distinctively smaller transparency than amorphous materials as used for CDs or DVDs. Then again, they have more distinctively improved mechanical properties. Partial crystalline polymers are particularly characterized by the fact that they are mechanically solid above the glass transition temperature and below the melting temperature but, however, are not brittle in contrast with amorphous polymers. Thus, the danger of a defect formation when detaching the mechanical shaping tool is reduced, through which the yield in the overall process of the device fabrication is increased.

The use of such partial crystalline materials as roughened substrate surface is, however, only possible in the case of a top-emitting OLED, as the poor optical properties would otherwise detrimentally and excessively affect the efficiency of the OLED device.

As an alternative for one embodiment of the invention, it can be envisaged to process a metal layer by means of mechanical shaping for the purpose of formation of the surface structure. Metals can be processed by means of various mechanical shaping methods which are known to the person skilled in the art as such. These include, for example, the embossing, the brushing and the printing. With this embodiment the metal layer on the side facing towards the stack of organic layers is provided with an insulating layer which consists of, for example, a polymer or silicon oxide.

The formation of the surface structure by means of mechanical shaping can be performed on the various embodiments of the invention either before the establishment of the bottom electrode or after its application.

In one embodiment, the use of doped charge carrier transport layers is envisaged with the advantage that the charge carrier transport layers can be formed very thick, namely between some 10 and some 100 nm. In this way, the device is less susceptible to rough substrates. In addition to this, the use of doped layers enables the deployment of a plurality of possible electrode materials as the discharge work of the electrode materials during the injection of charge carriers in doped layers exerts only a minor influence.

DESCRIPTION OF PREFERRED EMBODIMENTS OF THE INVENTION

Figure 1B:
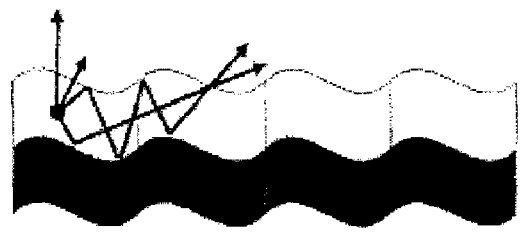
Figure 2:
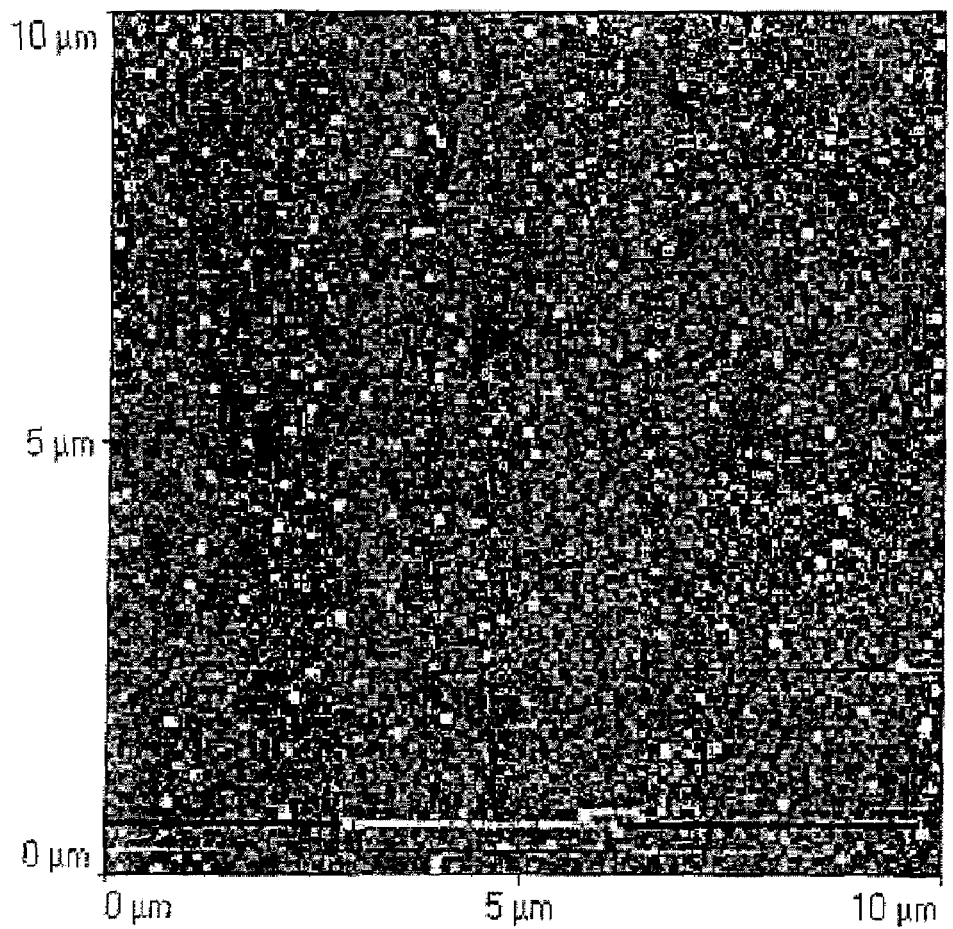
Figure 3:
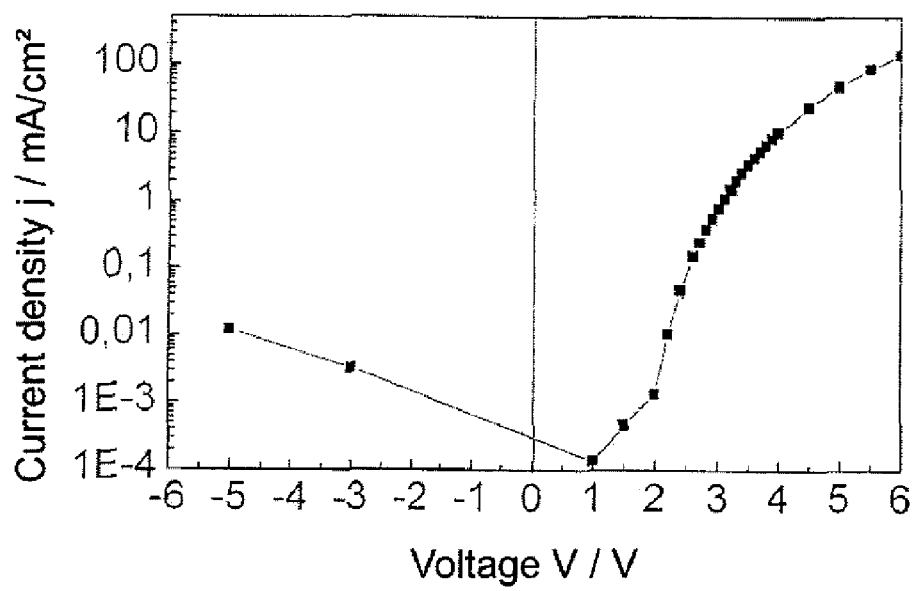
Figure 4:
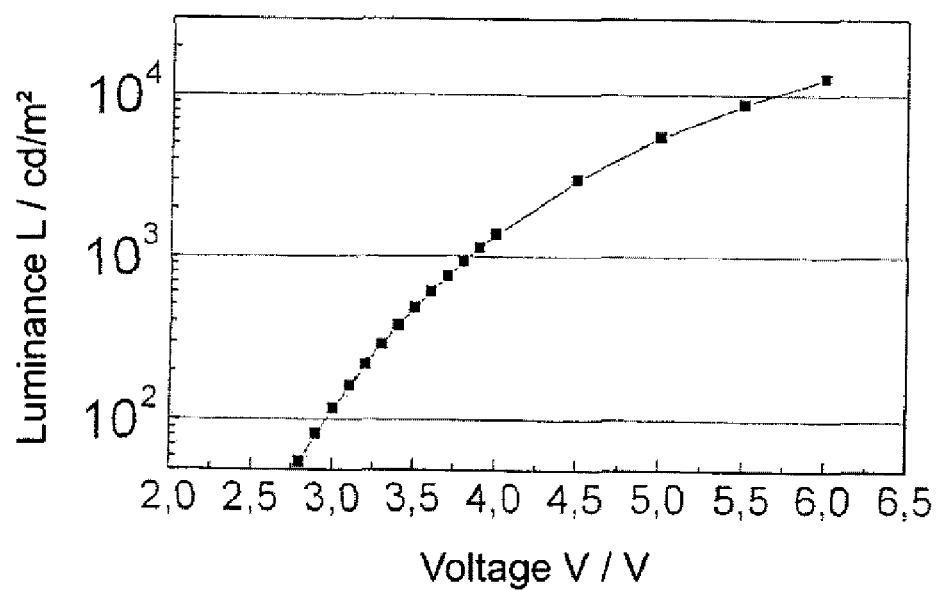
Figure 5:
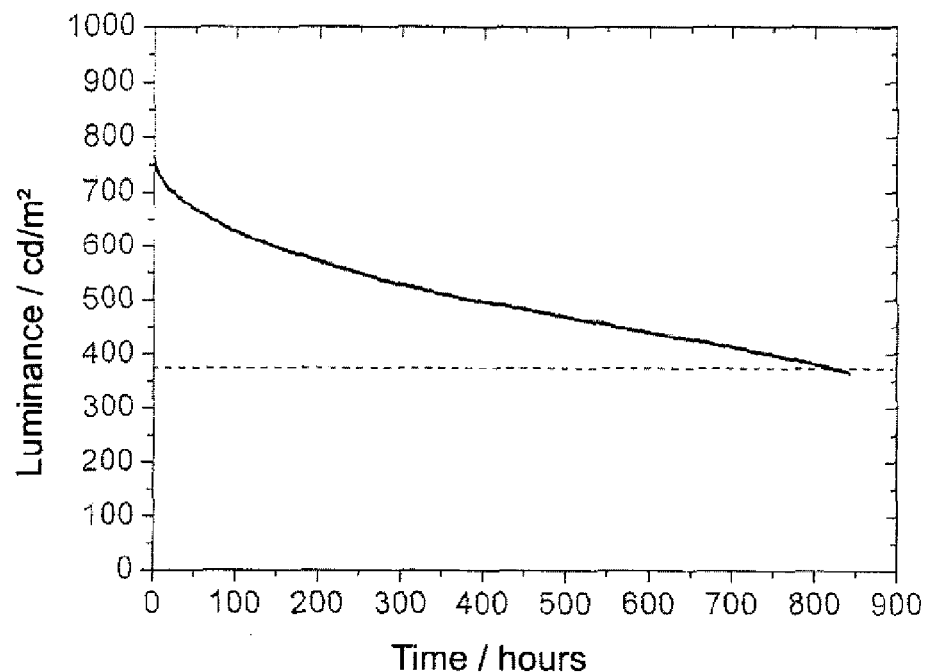
Figure 6:
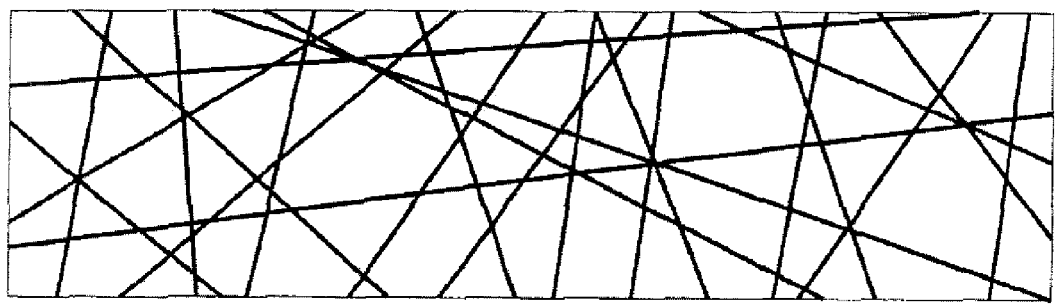
Figure 7:
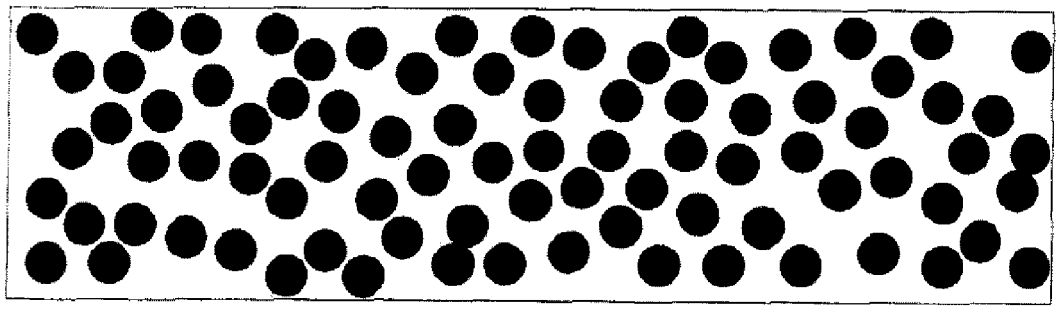

The invention is explained as follows in greater detail on the basis of embodiment examples with reference to the Figures of a drawing. The Figures show the following:

FIG. 1A Schematic illustration to explain a light reflection on a plane surface;

FIG. 1B Schematic illustration to explain a light reflection on a surface provided with a surface structure;

FIG. 2 Experimental results for a measurement of a surface structure by means of scanning force microscopy;

FIG. 3 A current density—voltage—characteristic for a top-emitting device;

FIG. 4 A luminance—voltage—characteristic for the top-emitting device;

FIG. 5 A graphic illustration of the luminance as a factor of the operating time for the top-emitting device;

FIG. 6 A schematic illustration for a surface configuration of an embossing stamp or an embossing roll; and FIG. 7 A schematic illustration for a further surface configuration of an embossing stamp or an embossing roll.

FIG. 8 A schematic illustration of a top-emitting device.

On a glass substrate at a temperature of 330° C. on a heating plate, a polytetrafluoro ethylene-co-hexafluoropropylene (FEP) pellet is melted on and pressed to a film on the glass surface by means of a silicon wafer. Then, the glass substrate is removed from the heating plate and cooled down on a cold surface. Now, the silicon wafer is removed from the cooled-down FEP film.

The silicon wafer used was roughened beforehand by means of a brief immersion in hydrofluoric acid. In this way, a surface structure occurs in the silicon dioxide layer of the wafer with a peak-valley-roughness of approximately 100 nm, which transfers itself as a negative imprint onto the FEP film.

Instead of the silicon wafer a polished steel plate can be used, into which irregular structures having a mean expansion of approximately 300 nm can be applied with, for example, a laser or with the use of photolithography. By pressing the steel plate onto the polymer, these structures are transferred as a negative imprint onto the polymer.

Instead of a flat-surface steel plate, a roll made from polished steel can be used for stamping. This has irregularly elevated or low-lying structures in the magnitude of 1 μm. In this case, the polymer is not heated to 330° C. but is structured at a temperature between 20° C. and 150° C. Instead of a substrate consisting of glass and a polymer layer, a so-called free-standing and flexible polymer film can be structured in a roll-to-roll method, as known in the printing industry.

In order to obtain a metallic base contact with the corresponding roughness, a 50 nm thick layer of aluminum or silver or chrome is vapor-deposited onto the substrate in a second step by means of thermal evaporation.

The roughness of such a chrome base contact was measured with scanning force microscopy and showed a peak-valley-roughness of 70 nm (FIG. 2). This layer was now used as an anode (bottom electrode) for a top-emitting device with the following layer structural configuration:
(1) 70 nm MeoTPD doped with 4% F4-TCNQ
(2) 10 nm α-NPD
(3) 20 nm TCTA doped with 10% fae-tris(2-phenylpyridine) iridium (Ir(ppy)3)
(4) 10 nm bathophene anthroline
(5) 50 nm bathophene anthroline doped with Cs (1:1 molar mixture)
(6) 15 nm silver as cathode The layers (1) to (5) form a stack of organic layers, in which then in form of the layer (6) the cathode is applied as top electrode.

This organic light-emitting device indicates a current efficiency of 14.6 cd/A at a luminance of over 100 cd/m$^2$ at a voltage of 3 V, and has a good current-voltage characteristic and a high blocking ratio of ~104 at ±5 V (FIG. 3). A luminance of 1000 cd/m$^2$ is achieved below 4 V. (FIG. 4).

The life service duration of this OLED device amounts to more than 800 hours at a starting luminance of approximately 850 cd/m$^2$ (refer to FIG. 5). in contrast, a comparable reference diode on a smooth substrate only produces a current efficiency of 12.0 cd/A at a luminance of 100 cd/m$^2$.

The FIGS. 6 and 7 show schematic illustrations for possible surface configurations of an embossing stamp or an embossing roll for use during mechanical form shaping. In this case, FIG. 6 shows a surface covered by an irregular groove pattern whereas FIG. 7 shows a surface with point-shaped structures in a coincidental arrangement. The embossing structures can be applied both in the form of recesses from a pattern or in form of elevated structures. More-over, a plurality of possible configurations is conceivable for the form of the structures. The grooves can have a round or corner-shaped profile, the point-shaped structures can be executed, for example, in form of truncated cones.

However, the patterns shown are merely examples. In principle, every kind of surface embossment can be used. Embossing structures are preferably selected whose profile is not so sharp-edged in order to avoid the danger of short-circuits in the stack of organic layers.

The features of the invention as disclosed in this description, in the claims and in the drawings can be of significance both individually as well as in random combination for the realization of the invention in its various embodiment forms.

The invention claimed is:

1. Top emitting organic light-emitting diode, having a layer arrangement applied on a substrate, which layer arrangement comprises a bottom electrode arranged on the substrate and a top electrode, through which a light emission occurs, and also a stack of organic layers arranged between the bottom electrode and the top electrode, in the case of the bottom electrode a surface facing the stack of organic layers being formed in a way to reflect light at least in a partial region and being provided with a surface structure that defines a reflection of light generated in the stack of organic layers at the bottom electrode, wherein the substrate is a polymer layer or a metal layer and structure elements of the surface structure have dimensions in the range of approximately 50 nm to approximately 50 μm.

2. Device according to claim 1, wherein the surface structure is formed by means of mechanical shaping of a polymer layer.

3. Device according to claim 1, wherein the substrate is formed by the polymer layer.

4. Device according to claim 1, wherein the substrate is made from a substrate material on which the polymer layer is applied.

5. Device according to claim 1, wherein the polymer layer is made from a ductile polymer material.

6. Device according to claim 1, wherein the polymer layer is made from a thermoplastic polymer material.

7. Device according to claim 1, wherein the polymer layer is made from a partly crystalline polymer material.

8. Device according to claim 1, wherein the surface structure is formed by means of mechanical shaping of a metal layer.

9. Device according to claim 1, wherein the substrate is formed by the metal layer.

10. Device according to claim 1, wherein the substrate is made from a substrate material on which the metal layer is applied.

11. Device according to claim 1, wherein the surface roughness is formed as an irregular surface structure.

12. Device according to claim 1, wherein the structure elements of the surface structure have dimensions in the region of the wavelength of visible light.

13. Device according to claim 1, wherein the surface structure is at least partly formed by means of stamping.

14. Device according to claim 1, wherein the surface structure is at least partly formed by means of pressure rolling.

15. Device according to claim 1, wherein the surface structure is at least partly formed by means of brushing.

16. Device according to claim 1, wherein the stack of organic layers comprises one or a plurality of doped charged carrier transport layers.

17. Illumination device having one or a plurality of devices according to claim 1.

* * * * *

UNITED STATES PATENT AND TRADEMARK OFFICE
CERTIFICATE OF CORRECTION

PATENT NO. : 7,589,463 B2  Page 1 of 1
APPLICATION NO. : 11/463697
DATED : September 15, 2009
INVENTOR(S) : Murano et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 437 days.

Signed and Sealed this

Twenty-first Day of September, 2010

David J. Kappos
*Director of the United States Patent and Trademark Office*